(12) United States Patent
Inoue et al.

(10) Patent No.: US 11,867,737 B2
(45) Date of Patent: Jan. 9, 2024

(54) DETECTION APPARATUS AND DETECTION METHOD

(71) Applicant: KABUSHIKI KAISHA TOSHIBA, Tokyo (JP)

(72) Inventors: Kazuhiro Inoue, Inagi Tokyo (JP); Tetsu Shijo, Setagaya Tokyo (JP); Yasuhiro Kanekiyo, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 17/682,665

(22) Filed: Feb. 28, 2022

(65) Prior Publication Data

US 2023/0076743 A1 Mar. 9, 2023

(30) Foreign Application Priority Data

Sep. 6, 2021 (JP) .................................. 2021-144877

(51) Int. Cl.
*G01R 29/08* (2006.01)
*G01R 31/34* (2020.01)

(52) U.S. Cl.
CPC ..... *G01R 29/0878* (2013.01); *G01R 29/0814* (2013.01); *G01R 29/0892* (2013.01); *G01R 31/343* (2013.01); *G01R 31/346* (2013.01)

(58) Field of Classification Search
CPC ............ G01R 29/0878; G01R 29/0814; G01R 29/0892; G01R 31/343; G01R 31/346
See application file for complete search history.

(56) References Cited

U.S. PATENT DOCUMENTS

| | | | |
|---|---|---|---|
| 9,075,115 B2 | 7/2015 | Younsi et al. | |
| 2007/0139056 A1 | 6/2007 | Kaneiwa et al. | |
| 2009/0302862 A1* | 12/2009 | Twerdochlib ...... | G01R 31/1272 324/536 |
| 2019/0079118 A1 | 3/2019 | Yanagita | |
| 2020/0103391 A1* | 4/2020 | Jung .................. | G01N 33/2841 |
| 2021/0123966 A1* | 4/2021 | Karin ..................... | G01R 31/62 |

FOREIGN PATENT DOCUMENTS

| | | |
|---|---|---|
| JP | H4-296673 A | 10/1992 |
| JP | H10-322824 A | 12/1998 |
| JP | 2006-58166 A | 3/2006 |
| JP | 2013-54031 A | 3/2013 |
| JP | 2019-54575 A | 4/2019 |

OTHER PUBLICATIONS

M. Sakai et al., "Online Diagnosis of Insulation Condition of Generators," Toshiba Review, vol. 63, No. 4, pp. 42-45 (2008).
S. Okada et al., "Online insulation diagnostic technology of the dynamo by a micro strip antenna ~Improvement in operation reliability of the dynamo by the online monitoring of partial discharge~," Electric Review, vol. 102, No. 6, pp. 66-70 (2017).

* cited by examiner

*Primary Examiner* — Jermele M Hollington
*Assistant Examiner* — Suresh K Rajaputra
(74) *Attorney, Agent, or Firm* — Finnegan, Henderson, Farabow, Garrett & Dunner, LLP

(57) ABSTRACT

According to one embodiment, a detection apparatus includes a pair of conductors configured to detect an electromagnetic wave occurring due to a discharge phenomenon in a target apparatus, wherein the pair of conductors are arranged in a near field region of the target apparatus in which the electromagnetic wave occurs.

23 Claims, 16 Drawing Sheets

DETECTION APPARATUS AND DETECTION METHOD

CROSS REFERENCE TO RELATED APPLICATIONS

This application is based upon and claims the benefit of priority from the prior Japanese Patent Application No. 2021-144877, filed on Sep. 6, 2021, the entire contents of which are incorporated herein by reference.

FIELD

Embodiments described herein relate to a detection apparatus and a detection method.

BACKGROUND

Apparatuses for detecting discharge phenomena occurring in equipment such as generators, include contact-type detection apparatuses (voltage pulse detection). It is difficult to retrofit (or post-install) the contact-type detection apparatuses in equipment such as generators. The contact-type detection apparatuses require maintenance by a skilled technician, which leads to high cost.

Non-contact type detection apparatuses have advantages of facilitating retrofitting to existing equipment. There is a high need for using non-contact type detection apparatuses. However, similar to typical wireless communication, the non-contact type detection apparatuses have a low reliability in places where high-level environmental noise is distributed in a broadband manner (e.g., a power station or the like).

DETAILED DESCRIPTION

Figure 1:
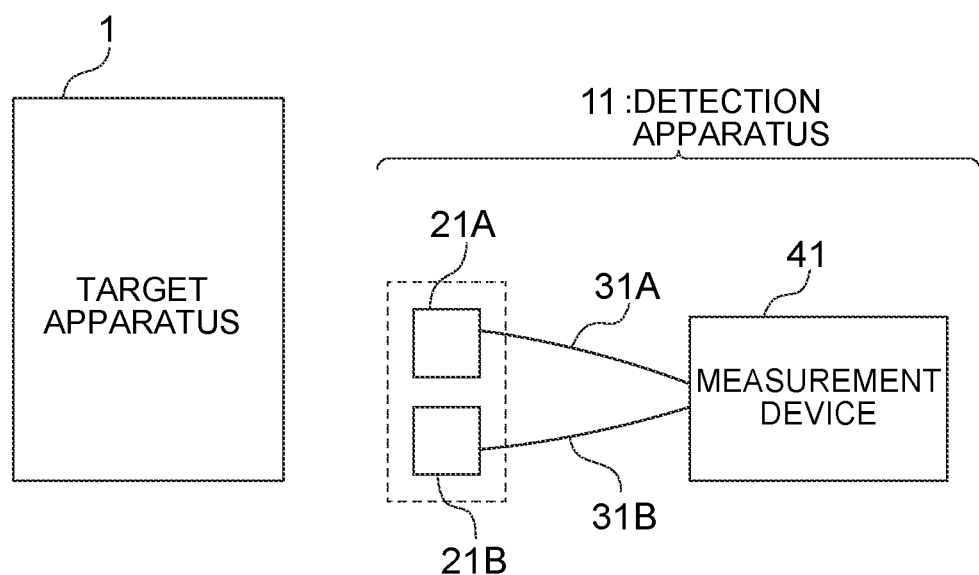
FIG. 1 is a block diagram of a detection system according to a first embodiment.

According to one embodiment, a detection apparatus includes a pair of conductors configured to detect an electromagnetic wave occurring due to a discharge phenomenon in a target apparatus, wherein the pair of conductors are arranged in a near field region of the target apparatus in which the electromagnetic wave occurs.

Hereinafter, referring to the diagrams, embodiments of the present invention are described. In the drawings, the same configuration elements are assigned the same numerals, and description is appropriately omitted.

FIG. 1 is a block diagram of a detection system 10 according to a first embodiment. The detection system 10 includes a target apparatus 1, and a non-contact type detection apparatus 11 that detects a discharge phenomenon occurring in the target apparatus 1. The target apparatus 1 is an apparatus that has a possibility of causing a discharge phenomenon during operation. Typical examples of the target apparatus 1 include generators (e.g., a turbine generator, a hydraulic generator, a water turbine generator, etc.), motors, and the like. For example, each of partial discharge occurring by reduction in insulation property in stator windings during operation of a rotator in a generator, and a discharge phenomenon, such as arc discharge occurring at a collector ring, is a cause of a failure in the generator. This embodiment highly reliably detects occurrence of a discharge phenomenon in the target apparatus 1.

The detection apparatus 11 includes a pair of conductors 21A and 21B, a measurement device 41, and signal lines 31A and 31B that respectively connect the pair of conductors 21A and 21B to the measurement device 41. The pair of conductors 21A and 21B are not grounded, and are connected to the measurement device 41 via the respective signal lines 31A and 31B. The measurement device 41 can be made up of a circuit, a processor, such as a CPU (Central Processing Unit), or a computer, etc.

The pair of conductors 21A and 21B detect electromagnetic waves caused due to a discharge phenomenon in the target apparatus, as the potential difference between the pair of conductors. The pair of conductors 21A and 21B are made of a metal, such as copper, for example. The discharge phenomenon is often accompanied by sparks. Accordingly, the configuration of the pair of conductors 21A and 21B made of the metal can achieve flame retardancy. Selection of appropriate metal processing, or use of an existing antenna production technique can achieve the pair of conductors at high reliability and low cost.

The pair of conductors 21A and 21B are arranged in a near field region of the target apparatus 1 (the generation source of electromagnetic waves) with respect to the occurring electromagnetic waves. The arrangement of the pair of conductors 21A and 21B in the near field region allows the pair of conductors 21A and 21B to detect the transient response (time-domain transient response) of the amplitude of electromagnetic waves occurring due to a discharge phenomenon. In the transient response, the amplitude (potential difference) of the signal to be detected largely changes. After the period of the transient response, the amplitude decreases.

As a specific example where the pair of conductors 21A and 21B are arranged in the near field region of the target apparatus 1, the distance between the target apparatus 1 and the pair of conductors 21A and 21B is described. The center frequency of electromagnetic waves occurring due to a discharge phenomenon is assumed as fc, and the wavelength corresponding to the center frequency fc is assumed as λc. The frequency of electromagnetic waves occurring due to a discharge phenomenon is basically determined specifically to the apparatus, and is preliminarily determined. In this case, the pair of conductors 21A and 21B are arranged so that the distance (distance of closest approach) between the pair of conductors 21A and 21B and the target apparatus 1 can be equal to or less than λc. In a case where the generation source of the discharge phenomenon is a stator winding of a generator, the pair of conductors 21A and 21B are arranged so that the distance (distance of closest approach) to the stator winding serving as the generation source of the discharge phenomenon (partial discharge) can be equal to or less than λc. The pair of conductors 21A and 21B are arranged according to this method, which can include the pair of conductors 21A and 21B in the near field region. The closer the position to the generation source of electromagnetic waves occurring due to the discharge phenomenon is, the more favorable the detection characteristics in the near field is. Accordingly, the detection performance of the discharge phenomenon is improved.

The signal lines 31A and 31B are respectively electrically connected to the pair of conductors 21A and 21B, and transmit (transfer) signals (signals including the transient response of the amplitude (potential difference) of electromagnetic waves) detected by the pair of conductors 21A and 21B, to the measurement device 41. The signals transferred by the signal lines 31A and 31B are input into the measurement device 41. The transferred signals are time-domain signals. The signal lines 31A and 31B correspond to the transmitter that transmits the signals detected by the pair of conductors 21A and 21B.

The measurement device 41 receives the signals detected by the pair of conductors 21A and 21B through the respective signal lines 31A and 31B. The measurement device 41 has a function of analyzing the signals, and a function of displaying data represented by the signals. For example, the measurement device 41 includes an oscilloscope, and a spectrum analyzer. The measurement device 41 displays, on a screen, data (e.g., the temporal waveform of transient response) represented by the received signals. A user, such as an administrator or an operator of the target apparatus, can verify the displayed temporal waveform, and confirm whether a discharge phenomenon occurs in the target apparatus 1.

The measurement device 41 measures the received signals, and determines presence or absence of a discharge phenomenon. For example, if an amplitude equal to or larger than a threshold, it can be determined that a discharge phenomenon occurs. The measurement device 41 may output information on presence or absence of occurrence of a discharge phenomenon together with information on the time of occurrence. Alternatively, the measurement device 41 may include a model of determining presence or absence of a discharge phenomenon from the temporal waveform, and determine the presence or absence of a discharge phenomenon on the basis of the model. For example, a regression model, such as of a neural network, may be used as the model. The measurement device 41 may display, on a screen, information indicating a determination result of presence or absence of occurrence of a discharge phenomenon, together with information on the time of occurrence. When the measurement device 41 determines the presence of a discharge phenomenon, this device may output an alert on a screen, or through a speaker.

Figure 2:
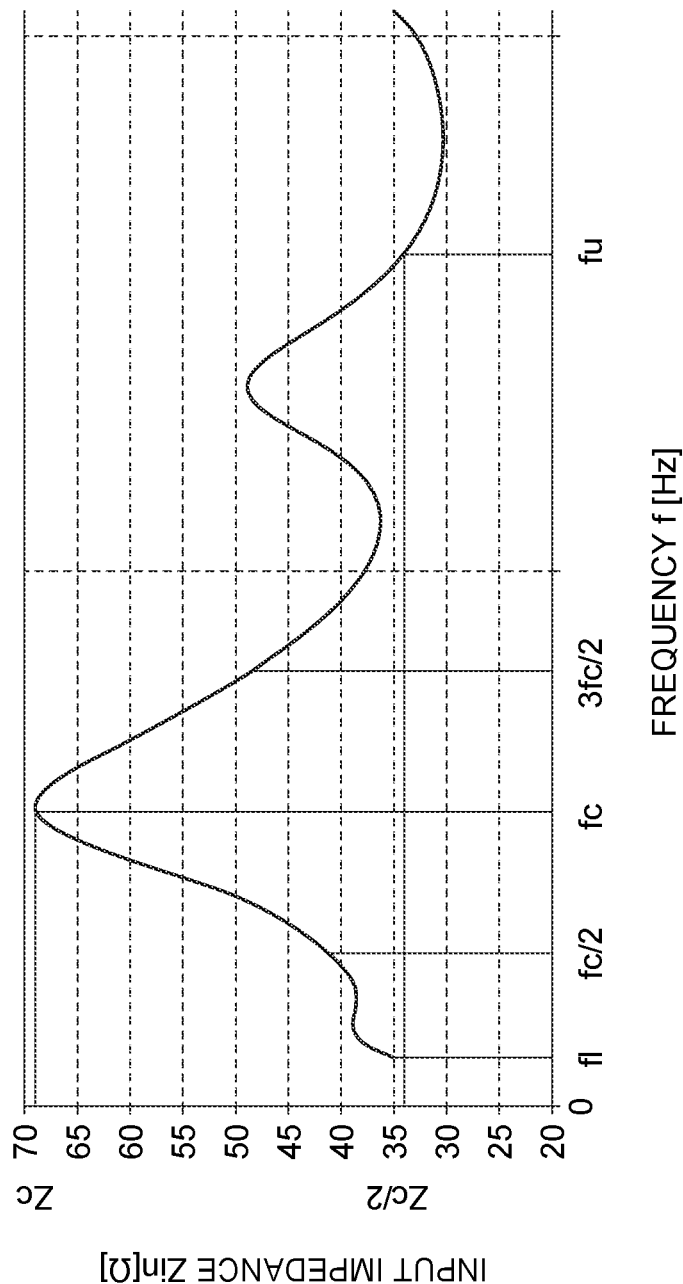
FIG. 2 shows input impedance characteristics between a pair of conductors in a case where signal lines are respectively connected to the pair of conductors.

FIG. 2 shows the input impedance characteristics of the pair of conductors 21A and 21B connected by the respective signal lines 31A an and 31B.

The input impedance Zin at the center frequency fc of electromagnetic waves occurring due to a discharge phenomenon is assumed as Zc. The lower limit frequency of a frequency range where the input impedance Zin is ½ of Zc is assumed as fl, and the upper limit frequency of this range is assumed as fu (fl<fu). The frequency range between the lower limit frequency fl and the upper limit frequency fu is wider than the frequency range of fc±fc/2 (fl<fc/2, 3fc/2<fu). That is, the pair of conductors have a small variation in impedance, and can be regarded to have broadband characteristics accordingly.

The characteristics with a small variation in input impedance allows the transient response signal (the signal of variation in amplitude of electromagnetic waves) to be more stably obtained. In comparison with a typical antenna that matches the input impedance to 50Ω, the pair of conductors that detect radio waves in the near field according to this embodiment have broadband characteristics surpassing the fractional bandwidth (=bandwidth/center frequency) of "100%". Unlike a typical antenna, the pair of conductors in this embodiment require no balun.

In this embodiment, a single pair of conductors is adopted. Alternatively, multiple pairs of conductors may be adopted. This allows electromagnetic waves occurring due to a discharge phenomenon to be detected in more multiple aspects (in multiple directions), which improves the reliability of detection. The details are described in a second embodiment.

Hereinafter, a specific example of the pair of conductors 21A and 21B is described.

Figure 3A:
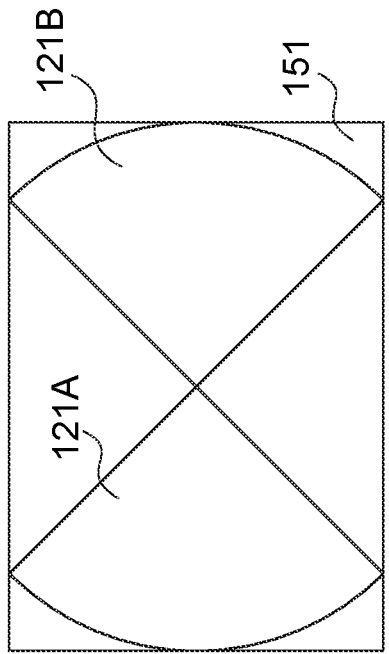
FIGS. 3A and 3B show a first specific example of a pair of conductors.
Figure 3B:
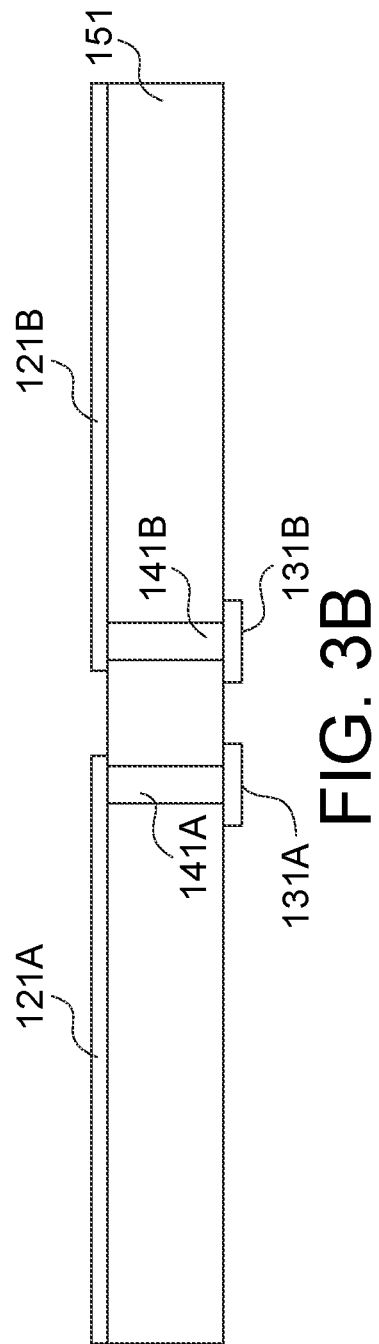

FIG. 3 shows a first specific example of the pair of conductors 21A and 21B. FIG. 3A is a plan view. FIG. 3B is a side sectional view. A pair of conductors 121A and 121B is formed by copper foil patterning, on one surface of a dielectric substrate 151. Signal lines 131A and 131B are formed on the other surface of the dielectric substrate 151, respectively via via holes (through-holes) 141A and 141B formed through the dielectric substrate 151.

Figure 4:
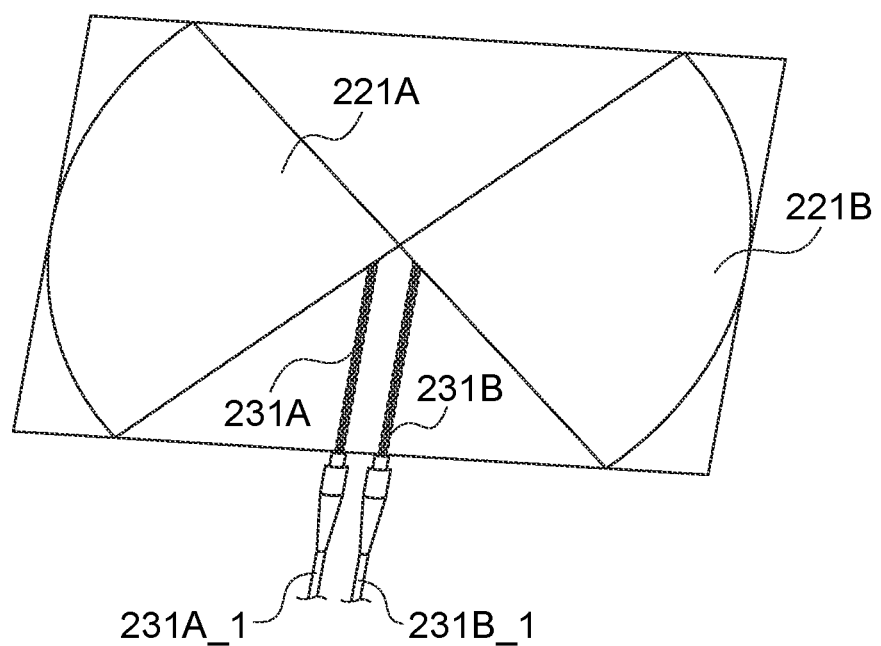
FIG. 4 shows a second specific example of a pair of conductors.

FIG. 4 shows a second specific example of the pair of conductors 21A and 21B. In the example in FIG. 4, signal lines 231A and 231B are formed on the same surface as the surface on which the pair of conductors 221A and 221B are formed. Parts of signal lines 231A and 231B close to the pair of conductors 221A and 221B are rod-shaped conductors, and the remaining parts are made up of cables 231A_1 and 231B_1 connected to the rod-shaped conductors.

Figures 5A, 5B:
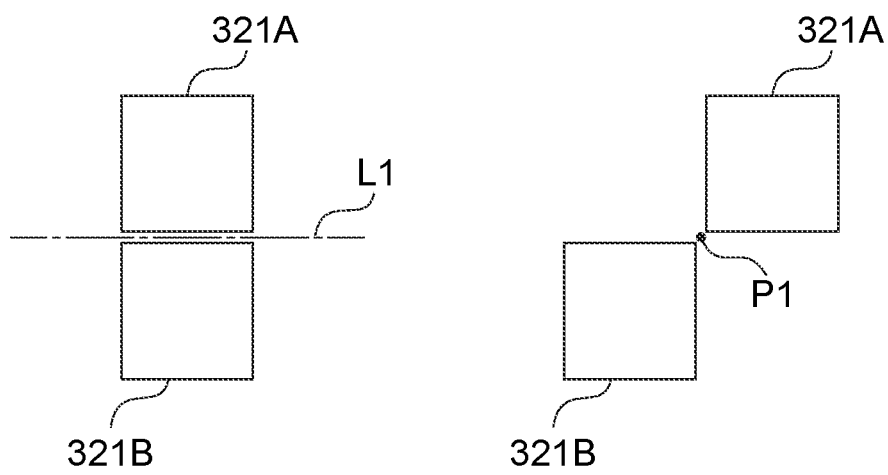
FIGS. 5A and 5B show a third specific example of a pair of conductors.

FIG. 5 shows a third specific example of the pair of conductors 21A and 21B. The shapes of the arranged pair of conductors 21A and 21B are point-symmetric or line-symmetric. In FIG. 5A, the conductors 321A and 321B having the same shape are arranged symmetrically with respect to a symmetric point or a symmetric line. The conductors 321A and 321B are arranged symmetric with respect to a line L1. In FIG. 5B, the conductors 321A and 321B having the same shape are arranged point-symmetric. The conductors 321A and 321B are arranged symmetric with respect to a point P1. In another example, the conductors 321A and 321B having the same shape may be arranged on symmetric planes. Such a symmetric structure achieves flat characteristics in a broadband manner with respect to the input impedance between the pair of conductors.

In a case where multiple pairs of conductors are arranged, a complementary structure (e.g., a structure with the gaps between the conductors having a grid shape) where the entire pairs of conductors (in a case of five pairs, ten conductors) symmetrically complement each other spatially as a whole.

In FIGS. 3A and 3B to FIGS. 5A and 5B described above, the single pair of conductors have the planar shape (plate shape). Hereinafter, referring to FIGS. 6A and 6B to FIGS. 11A to 11C, specific examples where at least one or both of the single pair of conductors have three-dimensional shapes are described.

Figure 6B:
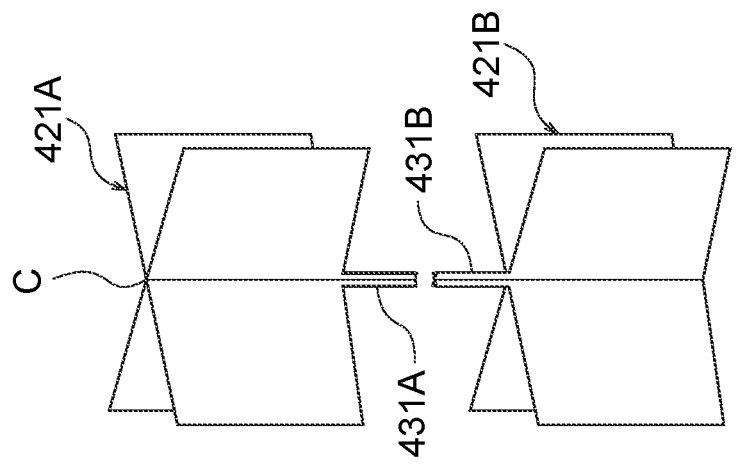
FIGS. 6A and 6B show a fourth specific example of a pair of conductors.
Figure 6A:
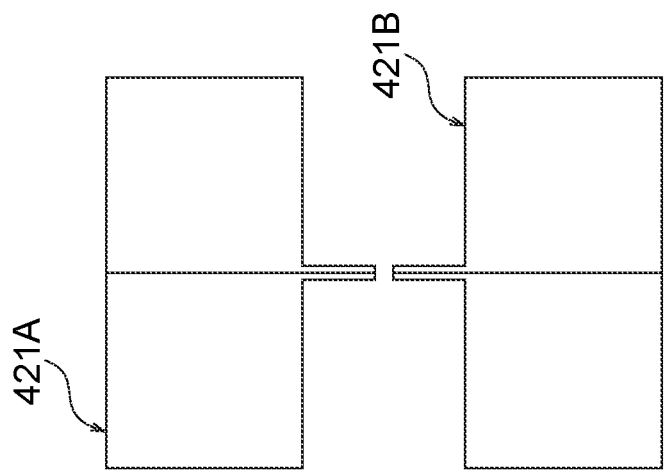

FIGS. 6A and 6B show a fourth specific example of the pair of conductors 21A and 21B. FIG. 6A is a front view. FIG. 6B is a perspective view. A pair of conductors 421A and 421B each include four conductor plates formed radially from a part (central shaft) along the central axis C. In a plan view, these four conductor plates deviate by about 90 degrees. That is, two adjacent conductor plates form about 90 degrees. The central shafts of the pair of conductors 421A and 421B partially project in a directions of facing each other. The signal lines 31A and 31B (not shown) are respectively connected to the projecting parts 431A, 431B. The sizes and shapes of the pair of conductors 421A and 421B are the same, but may be different from each other. The pair of conductors 421A and 421B have an advantage of being easily fabricable with sheet metal or the like.

Figure 7B:
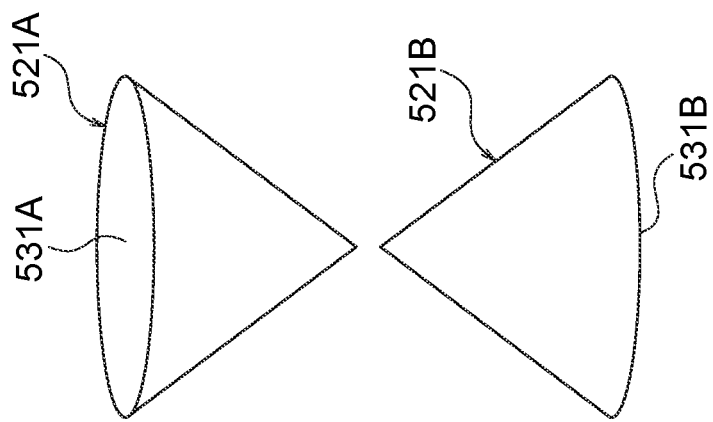
FIGS. 7A and 7B show a fifth specific example of a pair of conductors.
Figure 7A:
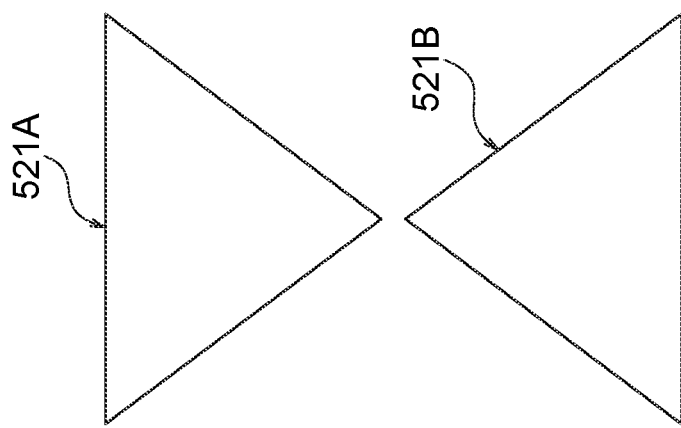

FIGS. 7A and 7B show a fifth specific example of the pair of conductors 21A and 21B. FIG. 7A is a front view. FIG. 7B is a perspective view. The pair of conductors 521A and 521B each have a conical shape. The pair of conductors 521A and 521B are only required to have a substantially conical shape, and are not required to have a strictly conical shape. The pair of conductors 521A and 521B may have a conical cylindrical shape without part of the distal end of a cone. In this case, the distal end part may be opened or closed. The bottom parts of the conductors 521A and 521B are opened. The insides of the conductors 521A and 521B are hollow. The apices of the cones face each other with an interval being secured therebetween. The sizes and shapes of the pair of conductors 521A and 521B are the same, but may be different from each other.

Figure 8B:
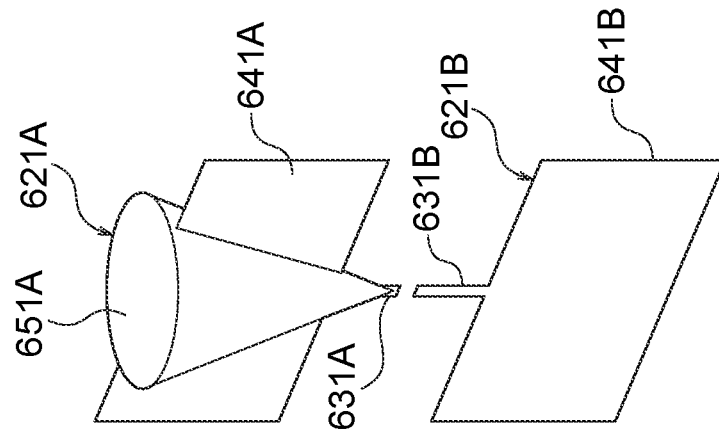
FIGS. 8A and 8B show a sixth specific example of a pair of conductors.
Figure 8A:
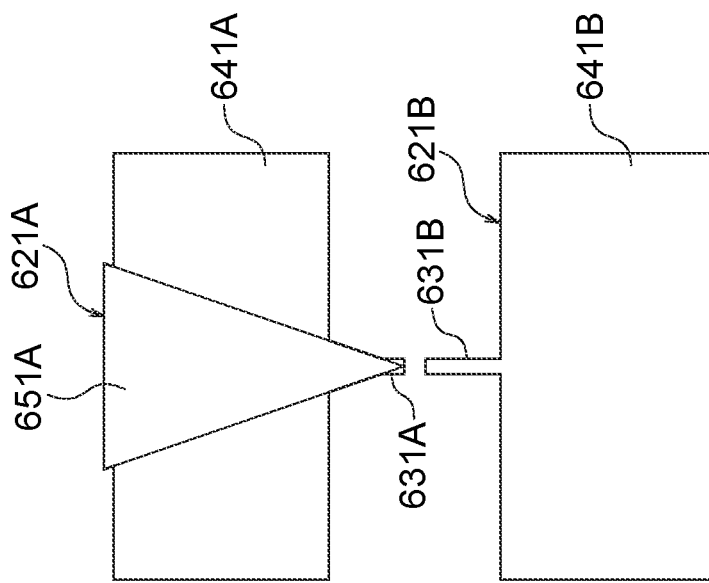

FIGS. 8A and 8B show a sixth specific example of the pair of conductors 21A and 21B. FIG. 8A is a front view. FIG. 8B is a perspective view. The conductor 621B between the pair of conductors 621A and 621B has a planar shape. The conductor 621B includes a rectangular conductor plate 641B, and a strip-shaped conductor 631B that projects outward from the center of one side of the rectangular conductor plate. The signal line 31B (not shown) is connected to the strip-shaped conductor.

The conductor 621A includes a conical conductor 651A, a conductor plate 641A coupled along two generatrices of the cone that are opposite to each other, and a strip-shaped conductor 631A coupled to the distal end of the cone. The signal line 31A (not shown) is connected to the strip-shaped conductor 631A. The conical conductor 651A is only required to have a substantially conical shape. The strip-shaped conductor 631A is coupled from the outside along the external shape of the distal end of the conical conductor. Alternatively, the distal end of the conical conductor 651A may be cut out for form a conical cylindrical shape, and a strip-shaped conductor may be coupled to the distal end of the conical cylindrical conductor. The configuration with the conical cylindrical conductor has an advantage of facilitating fabrication.

Figure 9B:
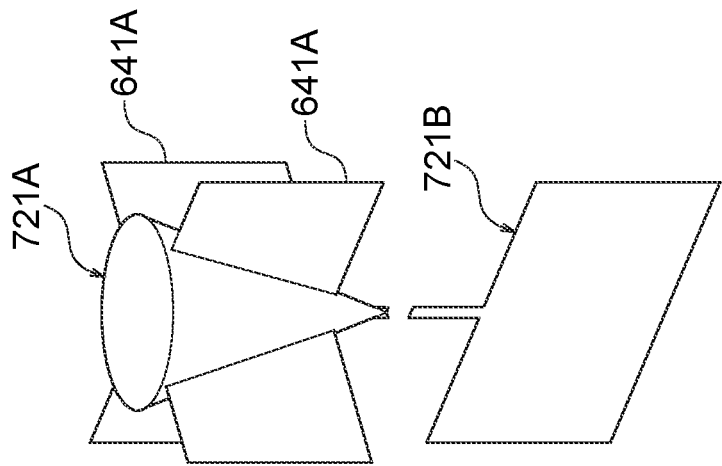
FIGS. 9A and 9B show a seventh specific example of a pair of conductors.
Figure 9A:
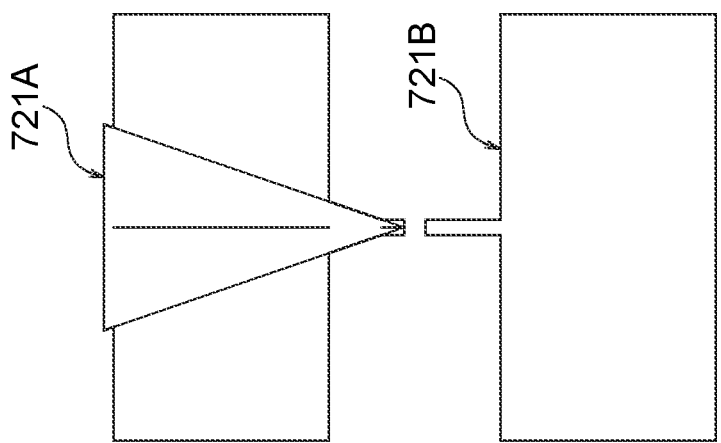

FIGS. 9A and 9B show a seventh specific example of the pair of conductors 21A and 21B. The conductors of the pair of conductors have different shapes. FIG. 9A is a front view. FIG. 9B is a perspective view. The conductor 721B between the pair of conductors 721A and 721B is the same as the conductor 621B in FIGS. 8A and 8B. The conductor 721A is obtained by further coupling two conductor plates 641A to the conductor 621A in FIGS. 8A and 8B along two generatrices of the cone that are opposite to each other. Accordingly, the number of conductor plates 641A coupled to the conical conductor is four. In a plan view, these four conductor plates deviate by about 90 degrees.

Figure 10B:
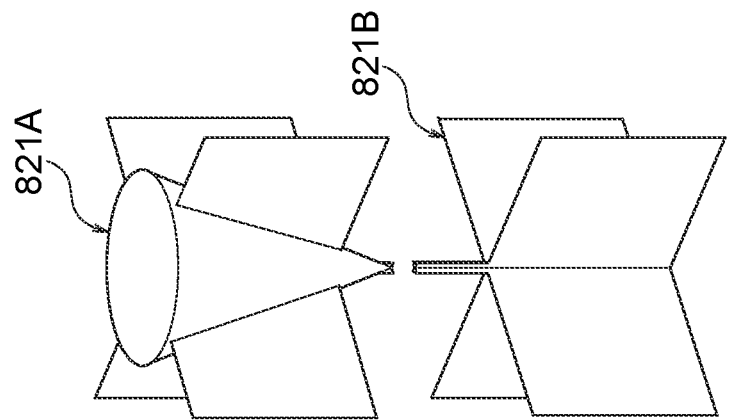
FIGS. 10A and 10B show an eighth specific example of a pair of conductors.
Figure 10A:
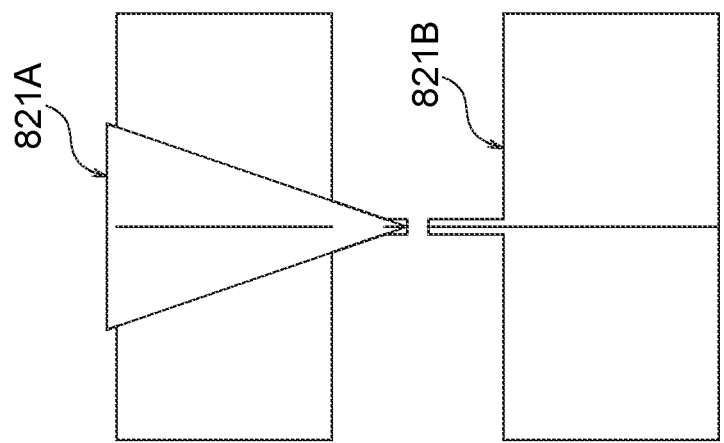

FIGS. 10A and 10B show an eighth specific example of the pair of conductors 21A and 21B. The conductors of the pair of conductors have different shapes. FIG. 10A is a front view. FIG. 10B is a perspective view. Between the pair of conductors 821A and 821B, the conductor 821A is the same as the conductor 721A in FIGS. 9A and 9B, and the conductor 821B is the same as the conductor 421B in FIGS. 6A and 6B.

Figure 11C:
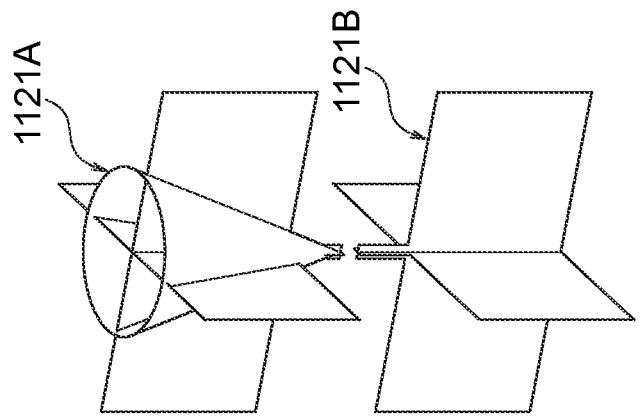
FIGS. 11A to 11C show a ninth specific example of a pair of conductors.
Figure 11B:
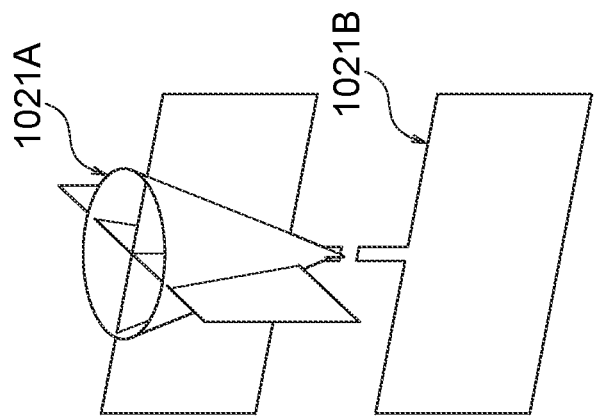
Figure 11A:
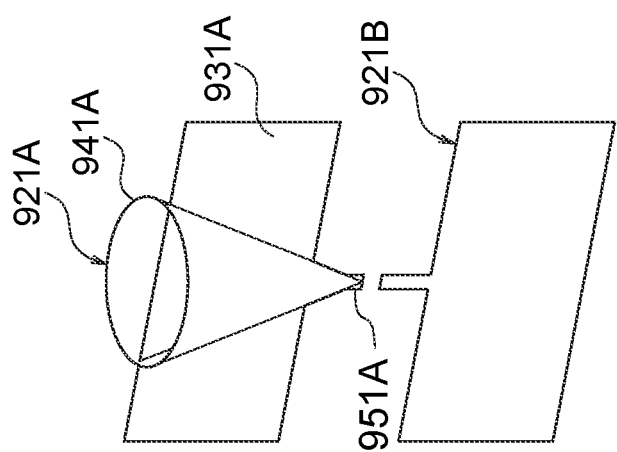

FIGS. 11A to 11C show a ninth specific example of the pair of conductors 21A and 21B. FIGS. 11A to 11C each show a perspective view, and show different examples. The conductors of the pair of conductors have different shapes.

In FIG. 11A, the conductor 921B between the pair of conductors 921A and 921B is the same as the conductor 621B in FIGS. 8A and 8B. The conductor 921A corresponds to what is obtained by halving a conductor 941A having the shape of a cone (or a conical cylinder having a narrow distal end) similar to that in FIGS. 7A and 7B along the center line in the height direction, and causing a strip 951A to intervene between both the distal ends on the corresponding surfaces of conductor 931A (having the same shape as the conductor 921B). The conductor 921A is similar to the conductor 621A in FIGS. 8A and 8B, but is different in that the inside of the conical conductor 941A is not hollow, and the conductor plate (part of the conductor 931A) is included. It can be considered so as to form a single conductor plate by extending two conductor plates coupled along generatrices of the conical conductor to the center line in the cone and connecting the plates to each other.

In FIG. 11B, the conductor 1021B between the pair of conductors 1021A and 1021B is the same as the conductor 921B in FIG. 11A. The conductor 1021A is obtained by applying modification similar to that of the conductor 921A in FIG. 11A, to the conductor 721A in FIGS. 9A and 9B. That is, it is conceivable that the conductor is obtained by extending the four plate-shaped conductors coupled to the external side of the conical conductor 721A, to the center line in the cone, and connecting the conductors to each other, thereby integrating the four plate-shaped conductors.

In FIG. 11C, between the pair of conductors 1121A and 1121B, the conductor 1121A is the same as the conductor 1021A in FIG. 11B, and the conductor 1121B is the same as the conductor 821B in FIGS. 10A and 10B.

As described above, according to this embodiment, transient change in electromagnetic field is detected in the near field, thereby allowing a discharge phenomenon occurring in the generator to be highly accurately detected. Even when radio waves from a distant field are detected by the pair of conductors 21A and 21B, the radio waves from the distant field are detected as a stable waveform having a small amplitude. Accordingly, the radio wave signal received from the distant field can be discriminated from the transient electromagnetic wave signal detected in the near field (see the lower diagram of FIG. 14 described later). Examples of radio waves from the distant field include broadcast waves and communication waves received from a distant location, and electromagnetic interference waves received from other apparatuses and equipment distant from the target apparatus 1.

Unlike a typical communication system that receives electromagnetic waves in a far field through an antenna, this embodiment does not require the pair of conductors to match a certain specific impedance (e.g., 50Ω), for detecting electromagnetic waves in the near field. Accordingly, in this embodiment, a balun (balanced-unbalanced conversion circuit) is not necessary, and is different from a radio wave reception configuration using a typical antenna. The technique of this embodiment is a technique different from an array antenna technique that uses multiple antennas and facilitates improvement in gain, assuming a far field.

According to this embodiment, the detection apparatus 11 is not in contact with the target apparatus 1. Consequently, even in a case where the target apparatus 1 is a large apparatus, such as a generator, ex-post installment (retrofitting) is easily achieved. This achieves low cost.

(Modification)

A configuration where one conductor of the single pair of conductors from the configuration in FIG. 1 is connected to the ground is not excluded. Note that in this case, there is a possibility that a noise signal is mixed via the ground. Accordingly, a denoise filter and the like may be added to the measurement device 41 or the like, thereby allowing a noise signal mixed from the ground to be removed or attenuated.

Second Embodiment

Figure 12:
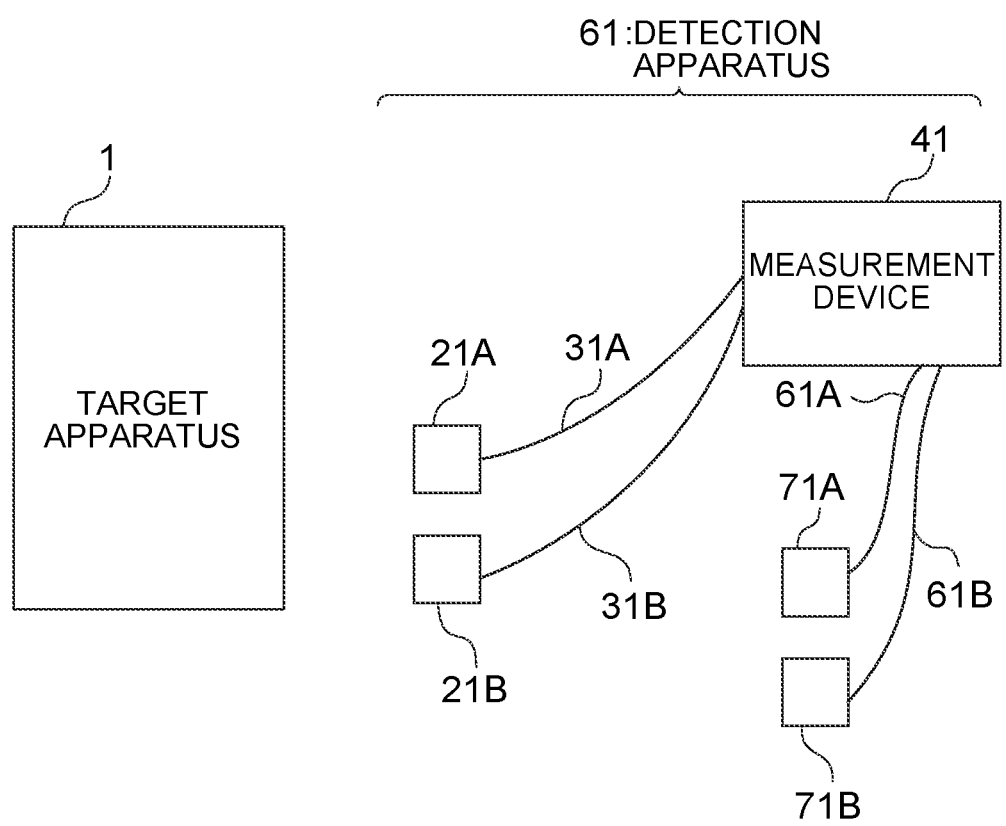
FIG. 12 is a block diagram of a detection system according to a second embodiment.

FIG. 12 is a block diagram of a detection system 60 according to a second embodiment. A detection apparatus 61 in the detection system 60 is obtained by adding a pair of conductors 71A and 71B, and signal lines 61A and 61B to the detection apparatus 11 in the first embodiment. That is, the second embodiment is provided with two pairs of conductors. The signal lines 61A and 61B respectively connect the pair of conductors 71A and 71B to a measurement device 41.

The pair of conductors 71A and 71B are arranged at distances different from the pair of conductors 21A and 21B with respect to the target apparatus 1. The pair of conductors 21A and 21B are arranged closer to the target apparatus 1 than the pair of conductors 71A and 71B. The orientations of the pair of conductors 21A and 21B with respect to the target apparatus 1 may be identical to or different from those of the pair of conductors 71A and 71B. Three or more pairs of conductors may be arranged at distances different from each other. The orientations of the three or more pairs of conductors may be identical to or different from each other.

The temporal characteristics of a transient response of electromagnetic waves occurring due to a discharge phenomenon are different according to the distance from the target apparatus 1 owing to delay and attenuation of radio waves. Accordingly, the configuration of multiple pairs of conductors can obtain different responses from the corresponding pairs of conductors. Broadcast waves and communication waves arriving from a distant field, and electromagnetic interference waves from other apparatuses and equipment are received as those having similar characteristics by the corresponding pairs of conductors. However, electromagnetic waves in the near field from the target apparatus 1 can be obtained as responses having different temporal characteristics. Consequently, the separating performance is improved.

Figure 13:
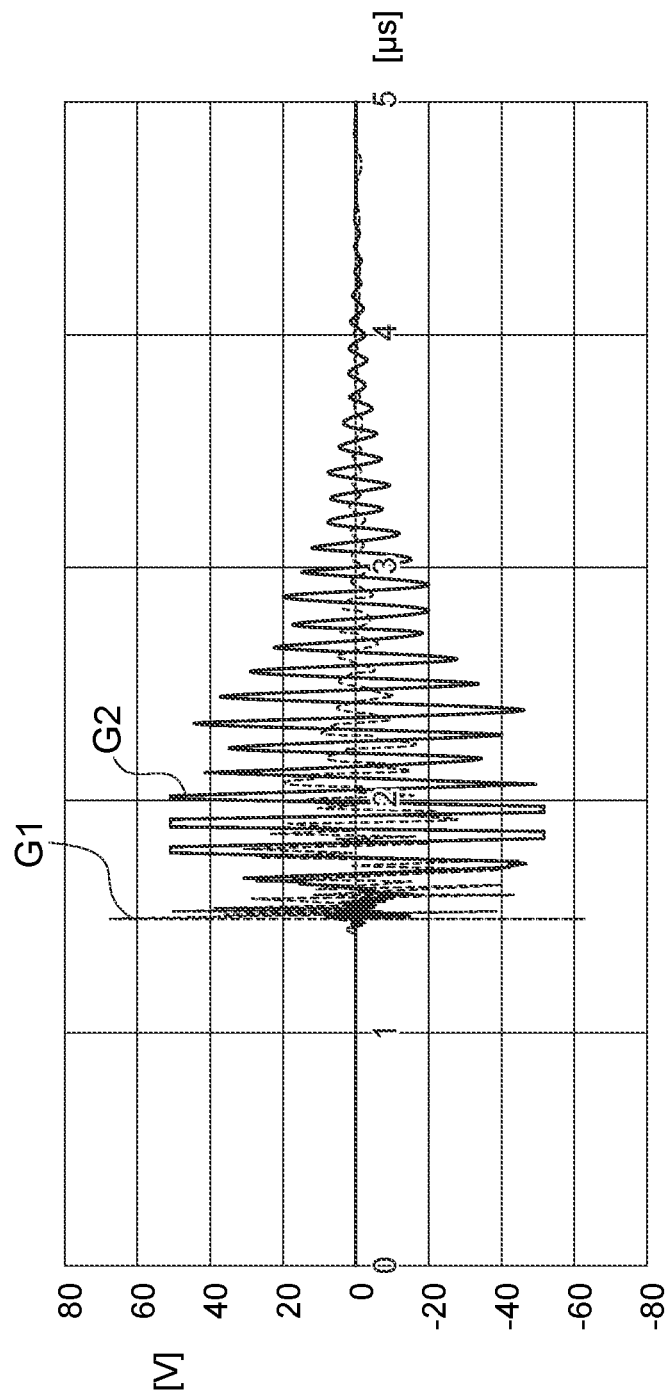
FIG. 13 shows waveform data obtained from each pair of conductors through an oscilloscope.

FIG. 13 shows waveform data obtained from each pair of conductors through an oscilloscope (measurement device 41). Waveform data in FIG. 13 is obtained by measuring temporal waveforms of occurrence of electromagnetic waves due to arc discharge through use of an arc welding machine. A temporal waveform G1 represents a transient response of the potential difference (amplitude) between the pair of conductors 21A and 21B closest to the target apparatus 1. A temporal waveform G2 represents a transient response of the potential difference (amplitude) between the pair of conductors 71A and 71B distant from the target apparatus 1. The temporal waveform G1 suddenly rises after start of arc discharge, and the amplitude (potential difference) decreases with time. According to the temporal waveform G2, after delay with distance, a waveform having a smaller amplitude than the temporal waveform G1 rises, and subsequently, the amplitude decreases with time, similarly to the temporal waveform G1.

Figure 14:
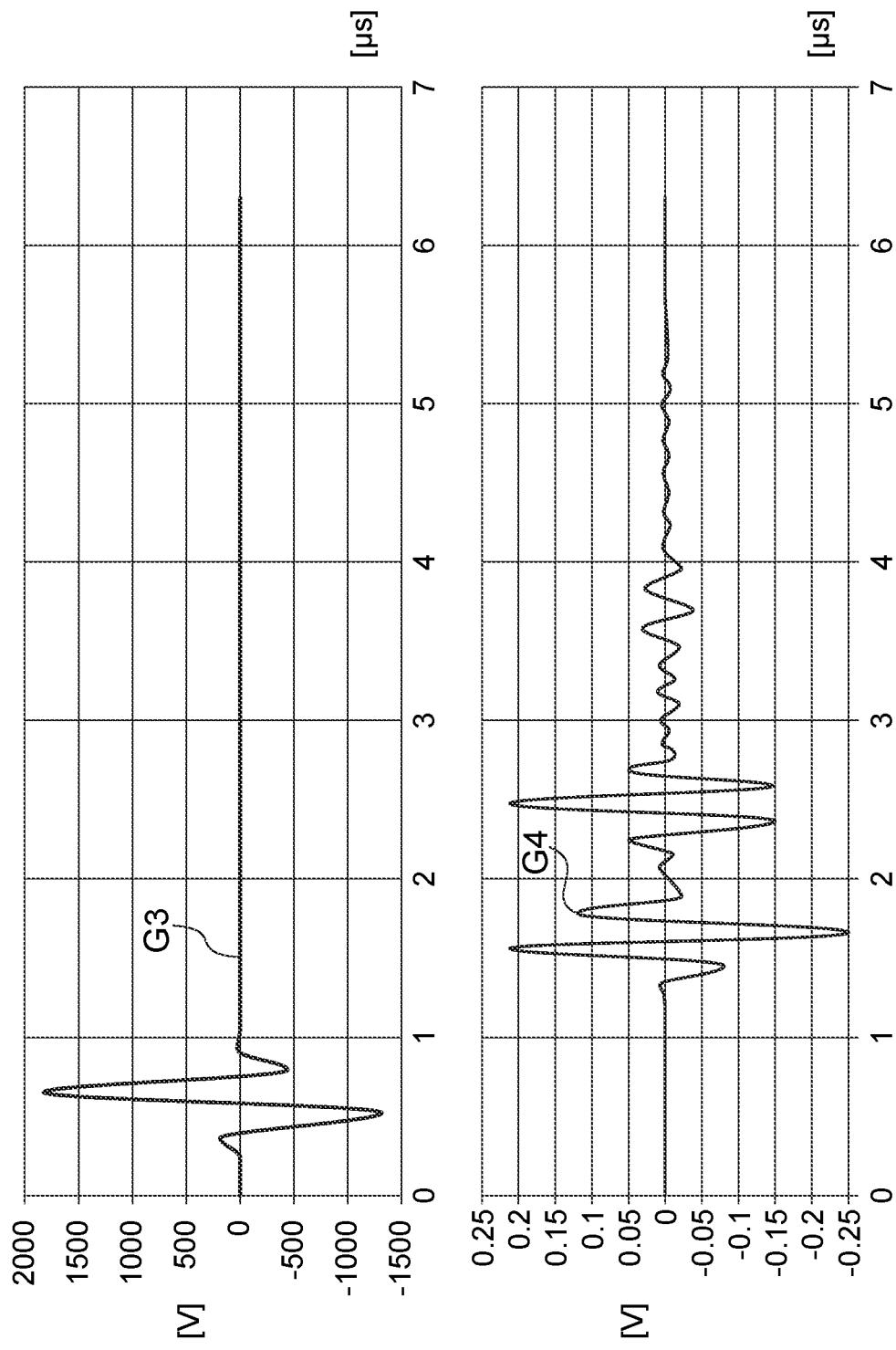
FIG. 14 shows an analysis example of a time-response waveform through an electromagnetic field simulation.

FIG. 14 shows an analysis example of a time-response waveform through an electromagnetic field simulation. Here, a case of using only one pair of conductors is indicated. A temporal waveform G3 indicates an incident pulse simulating the wave source of electromagnetic waves occurring due to a discharge phenomenon. The large change (or fluctuation) in amplitude of the temporal waveform G3 represents occurrence of a discharge phenomenon, such as sparks. A temporal waveform G4 indicates the time-response waveform of the potential difference between a pair of conductors. After occurrence of the incident pulse, the change in amplitude starts. According to the frequency characteristics of the delay and attenuation dependent on the distance from the target apparatus (the wave source of electromagnetic waves), the situations of change in the waveform of the detected potential difference are found. That is, the incident pulse includes frequency components serving as main components. According to the differences in the delay and attenuation characteristics dependent on the distance, the detected waveform changes dependent on the lapse of time.

The attenuation characteristics of electromagnetic waves can generally be represented by the following Expression (1).

[Expression 1]

$$\frac{1}{(fr)^3} + \frac{1}{(fr)^2} + \frac{1}{fr} \tag{1}$$

The first term (left) is an electrostatic term. The second term is the Biot-Savart term. The third term (right) is a radiative term. The electrostatic term and the Biot-Savart term represent the characteristics of the near field. The radiative term represents the far field. After lapse of time, the temporal waveform G4 has a short stationary vibration waveform. This waveform represents electromagnetic waves received from the far field. Accordingly, by removing the component corresponding electromagnetic waves received from the far field from the temporal waveform G4, the component of electromagnetic waves received in the near field can be identified, thereby allowing presence or absence of occurrence of a discharge phenomenon to be highly accurately determined.

Third Embodiment

Figure 15:
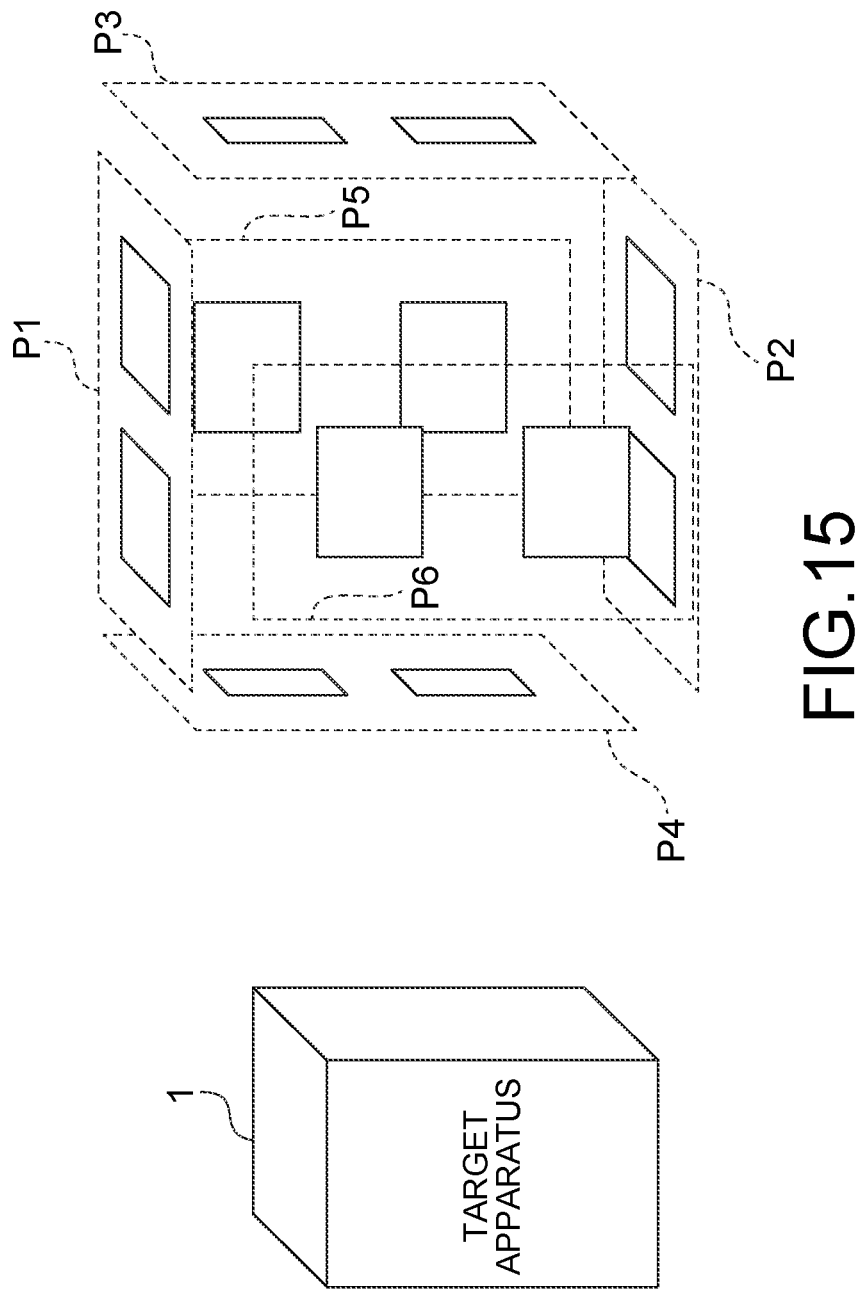
FIG. 15 shows an example where six pairs of conductors are arranged in different directions with respect to a target apparatus.

FIG. 15 shows an example where six pairs of conductors (P1, P2, P3, P4, P5 and P6) are arranged in different orientations with respect to the target apparatus 1. To easily identify individual pairs, the pairs are respectively encircled by broken-line frames. If a cuboid or a cube is assumed, the six pairs of conductors are arranged along the faces of the cuboid or the cube. In a space encircled by the six pairs of conductors, the measurement device 41 and the like may be arranged. The conductors of the pairs P1 to P6 are connected to the measurement device 41 via signal lines. The conductors of the pairs have the same shape. As with the first embodiment described above, the shapes, sizes and the like of the pairs may be variously defined.

The detection performance of the pair of conductors has a directionality. Accordingly, arrangement of the multiple pairs of conductors in different directions with respect to the target apparatus 1 can improve the detection performances in various directions. Consequently, the performance of detecting transient change in electromagnetic waves occurring due to a discharge phenomenon can be improved.

Fourth Embodiment

Figure 16:
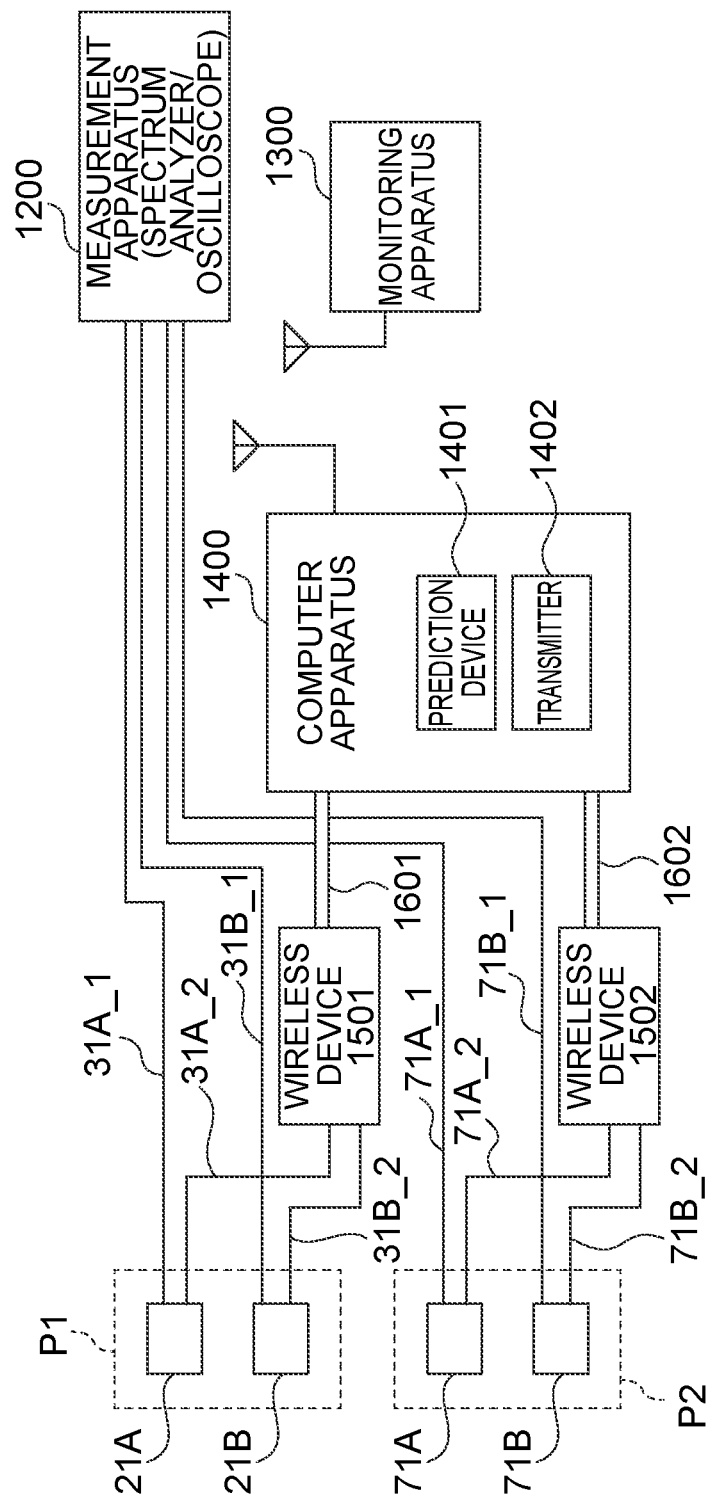
FIG. 16 is a block diagram of a discharge monitoring system according to a fourth embodiment.

FIG. 16 is a block diagram of a discharge monitoring system according to a fourth embodiment. The two pairs of conductors (the pair P1 of conductors 21A and 21B, and the pair P2 of conductors 71A and 71B), wireless devices 1501 and 1502 respectively supporting the two pairs P1 and P2, a computer apparatus 1400, a measurement apparatus 1200, and a monitoring apparatus 1300. The measurement apparatus 1200 includes a spectrum analyzer, and an oscilloscope. The measurement apparatus 1200 has a function similar to that of the measurement device 41 in FIG. 1. The two pairs of conductors are thus used. Alternatively, three or more pairs of conductors (e.g., six pairs of conductors) may be used. In this case, depending on the number of pairs of conductors, the number of wireless devices may be increased. The two pairs P1 and P2 are arranged in the near field region of the target apparatus 1 (not shown).

The conductors 21A and 21B of the pair P1 are respectively connected to the measurement apparatus 1200 via signal lines 31A_1 and 31B_1. The conductors 71A and 71B of the pair P2 are respectively connected to the measurement apparatus 1200 via signal lines 71A_1 and 71B_1. Any type of transfer cables, such as coaxial cables, can be used as the signal lines 31A_1, 31B_1, 71A_1 and 71B_1. The measurement apparatus 1200 analyzes whether a discharge phenomenon occurs in the target apparatus 1, on the basis of a detection signal from the pair P1 and a detection signal from the pair P2. The analysis is performed at every constant time period. For example, if an amplitude equal to or larger than a threshold in the detection signal of any of the pair, it can be determined that a discharge phenomenon occurs. The measurement apparatus 1200 may output information on presence or absence of occurrence of a discharge phenomenon together with information on the time of occurrence. The measurement apparatus 1200 may display the detection signal of each pair on a screen, and allow a user, such as an observer or an operator, to determine presence or absence of a discharge phenomenon. Use of multiple pairs can solve or reduce the problem of directionality of detection performance, and achieve highly accurate determination.

The conductors 21A and 21B of the pair P1 are respectively connected to the wireless device 1501 via signal lines 31A_2 and 31B_2. The wireless device 1501 converts the detection signal from the pair P1 into a digital signal, and outputs the signal to the computer apparatus 1400 via a communication cable 1601, such as USB (Universal Serial Bus) cable. Likewise, the conductors 71A and 71B of the pair P2 are respectively connected to the wireless device 1502 via signal lines 71A_2 and 71B_2. The wireless device 1502 converts the detection signal from the pair P2 into a digital signal, and outputs the signal to the computer apparatus 1400 via a communication cable 1602, such as USB cable. Note that the wireless device 1501 may individually output digital signals obtained by digitizing detection signals from the conductors 21A and 21B, or calculate the amplitude (potential difference) from the difference between the digital signals and output a digital signal of the amplitude. Likewise, the wireless device 1502 may individually output digital signals obtained by digitizing detection signals from the conductors 71A and 71B, or calculate the amplitude (potential difference) from the difference between the digital signals and output a digital signal of the amplitude. The signal lines 31A_2 and 31B_2 may be connected to a balun, and the balun may be connected to the wireless device 1501 by one coaxial cable. Likewise, the signal lines 71A_2 and 71B_2 may be connected to a balun, and the balun may be connected to the wireless device 1502 by one coaxial cable. It may be switched whether to output the detection signals of the pair P1 and the pair P2 to the measurement apparatus 1200 or to the wireless devices 1501 and 1502, according to the setting of the wireless devices 1501 and 1502. The setting of switching of the wireless devices 1501 and 1502 may be performed by transmitting instruction data from the monitoring apparatus 1300 or the measurement apparatus 1200 to the wireless devices 1501 and 1502. Alternatively, the user may operate the computer apparatus 1400 to set switching of the wireless devices 1501 and 1502.

The computer apparatus 1400 predicts presence or absence of a failure or presence or absence of a failure sign of the target apparatus 1, based on a digital signal obtained by digitizing the detection signal from the pair P1 and on a digital signal obtained by digitizing the detection signal from the pair P2. The computer apparatus 1400 includes a prediction device 1401 that predicts presence or absence of a failure or a failure sign of the target apparatus 1.

For example, the prediction device 1401 counts the number of peaks (pulses) per constant time period. If the number of counts is equal to or higher than a threshold, this device determines presence of a failure sign or the like.

Alternatively, a prediction model of presence or absence of a failure sign (or presence or absence of a failure) is preliminarily generated by machine learning. The prediction device 1401 may predict presence or absence of a failure sign, based on the prediction model and digital data obtained by digitizing the detection signal of each pair. For example, the prediction model can be generated by machine learning, using digital data on each detection signal in a case of presence of a failure sign, and digital data on each detection signal in a case of absence of a failure sign, as teacher data (training data). The prediction model may be any model, such as a neural network, a multiple regression model, or a logistic regression model.

The computer apparatus 1400 transmits data indicating a prediction result of a failure sign to the monitoring apparatus 1300 via a wireless network. The computer apparatus 1400 includes a transmitter 1402 that transmits the prediction result of the failure sign. Examples of the wireless network include a wireless LAN (Local Area Network), Bluetooth (R), and a cellular communication network. Instead of the wireless network, a wired network may be used. Examples of the wired network include a USB cable, an HDMI (High-Definition Multimedia Interface) cable, and a wired LAN.

The user, such as the operator or the observer of the monitoring apparatus 1300, may confirm the prediction result on the monitor of the monitoring apparatus 1300. In case a failure sign is detected, the user may go to the installation site of the target apparatus 1, and confirm actual states (a failure or a failure sign) of the target apparatus 1. Alternatively, the user may go to the installation site, and confirm presence or absence of a discharge phenomenon through the measurement apparatus 1200.

According to the embodiments, detection of electromagnetic waves occurring due to a discharge phenomenon can be highly accurately achieved. Consequently, a weak, initial discharge phenomenon can be detected, and a failure or a failure sign of the target apparatus occurring due to a discharge phenomenon can be preliminarily predicted.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A detection apparatus comprising:
a plurality of pairs of conductors configured to detect an electromagnetic wave occurring due to a discharge phenomenon in a target apparatus,
wherein the plurality of the pairs of conductors are arranged in a near field region of the target apparatus in which the electromagnetic wave occurs, and
wherein the plurality of the pairs of conductors are arranged at different distances from the target apparatus.

2. The detection apparatus according to claim 1,
wherein each pair of conductors of the plurality of the pairs of conductors detects an amplitude of the electromagnetic wave through a potential difference between the pair of conductors.

3. The detection apparatus according to claim 1, further comprising
a measurement device configured to be electrically connected to each of the plurality of the pairs of conductors, and receive a signal detected by each of the plurality of the pairs of conductors.

4. The detection apparatus according to claim 1,
wherein a signal detected by each of the plurality of the pairs of conductors represents a transient response of an amplitude of the electromagnetic wave.

5. The detection apparatus according to claim 1,
wherein each of the pair plurality of the pairs of conductors includes a metal.

6. The detection apparatus according to claim 1,
wherein a distance between the target apparatus and each of the plurality of the pairs of conductors is equal to or less than a wavelength corresponding to a center frequency of the electromagnetic wave.

7. The detection apparatus according to claim 1,
wherein each of the plurality of the pairs of conductors have point-symmetric, line-symmetric or plane-symmetric shapes.

8. The detection apparatus according to claim 1,
wherein each of the plurality of the pairs of conductors have planar shapes.

9. The detection apparatus according to claim 1,
wherein each of the plurality of the pairs of conductors have three-dimensional shapes.

10. The detection apparatus according to claim 1,
wherein each of the plurality of the pairs of conductors have shapes different from each other.

11. The detection apparatus according to claim 1,
wherein the plurality of the pairs of conductors are arranged in different orientations with respect to the target apparatus.

12. The detection apparatus according to claim 3, wherein the measurement device is configured to, determine whether the discharge phenomenon occurred, based on a measurement result of the signal.

13. The detection apparatus according to claim 12,
wherein the measurement device displays data representing change in an amplitude of the electromagnetic wave, based on the signal.

14. The detection apparatus according to claim 1,
wherein the target apparatus is a generator.

15. The detection apparatus according to claim 14,
wherein the discharge phenomenon is partial discharge occurring in a stator winding in the generator, and
wherein each of the plurality of the pairs of conductors are arranged in a near field region of the stator winding in which the electromagnetic wave occurs.

16. The detection apparatus according to claim 14,
wherein the discharge phenomenon is arc discharge occurring in a collector ring in the generator, and
wherein each of the plurality of the pairs of conductors are arranged in a near field region of the collector ring in which the electromagnetic wave occurs.

17. The detection apparatus according to claim 1,
wherein the discharge phenomenon is at least any of spark discharge, corona discharge, glow discharge, and arc discharge.

18. The detection apparatus according to claim 3, further comprising
a prediction device configured to predict a failure or a failure sign of the target apparatus, based on the signal received by the measurement device.

19. The detection apparatus according to claim 18, further comprising
a transmitter configured to transmit a prediction result of the failure or the failure sign to a monitoring apparatus.

20. A detection method comprising:
detecting, by a plurality of the pairs of conductors, an electromagnetic wave occurring due to a discharge phenomenon in a target apparatus,
wherein each of the plurality of the pairs of conductors are arranged in a near field region of the target apparatus in which the electromagnetic wave occurs, and
wherein the plurality of the pairs of conductors are arranged at different distances from the target apparatus.

21. A detection apparatus comprising:
a pair of conductors configured to detect an electromagnetic wave occurring due to a discharge phenomenon in a target apparatus,
wherein the pair of conductors are arranged in a near field region of the target apparatus in which the electromagnetic wave occurs, and
wherein the pair of conductors have three-dimensional shapes.

22. A detection apparatus comprising:
a pair of conductors configured to detect an electromagnetic wave occurring due to a discharge phenomenon in a target apparatus,
wherein the pair of conductors are arranged in a near field region of the target apparatus in which the electromagnetic wave occurs, and wherein the pair of conductors have shapes different from each other.

23. A detection apparatus comprising:

a plurality of pairs of conductors configured to detect an electromagnetic wave occurring due to a discharge phenomenon in a target apparatus, wherein the plurality of the pairs of conductors are arranged in a near field region of the target apparatus in which the electromagnetic wave occurs, wherein the plurality of the pairs of conductors are arranged in different orientations with respect to the target apparatus.

\* \* \* \* \*

UNITED STATES PATENT AND TRADEMARK OFFICE
CERTIFICATE OF CORRECTION

PATENT NO. : 11,867,737 B2
APPLICATION NO. : 17/682665
DATED : January 9, 2024
INVENTOR(S) : Inoue et al.

It is certified that error appears in the above-identified patent and that said Letters Patent is hereby corrected as shown below:

In the Claims

• Claim 5, Column 11, Line 51, "wherein each of the pair plurality of the pairs" should read --wherein each of the plurality of the pairs--.

• Claim 12, Column 12, Line 9, "configured to, determine" should read --configured to determine--.

Signed and Sealed this
Nineteenth Day of March, 2024

Katherine Kelly Vidal
*Director of the United States Patent and Trademark Office*